(12) United States Patent
Shiozawa et al.

(10) Patent No.: US 7,714,439 B2
(45) Date of Patent: May 11, 2010

(54) NITRIDE SEMICONDUCTOR DEVICE AND METHOD OF MANUFACTURING THE SAME

(75) Inventors: Katsuomi Shiozawa, Tokyo (JP); Hitoshi Sakuma, Tokyo (JP); Kazushige Kawasaki, Tokyo (JP); Toshihiko Shiga, Tokyo (JP); Toshiyuki Oishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/844,707

(22) Filed: Aug. 24, 2007

(65) Prior Publication Data

US 2008/0116575 A1 May 22, 2008

(30) Foreign Application Priority Data

Nov. 20, 2006 (JP) .............................. 2006-312533

(51) Int. Cl.
*H01L 23/48* (2006.01)
*H01L 21/4763* (2006.01)
(52) U.S. Cl. ....................... 257/750; 438/660
(58) Field of Classification Search ................. 257/615, 257/750, E21.476, E23.01, E23.99, E21.09, 257/E29.093; 438/660, 154, 509
See application file for complete search history.

(56) References Cited

U.S. PATENT DOCUMENTS

| 2006/0003490 A1* | 1/2006 | Shiozawa et al. ........... 438/106 |
| 2006/0108596 A1* | 5/2006 | Shiozawa et al. ............. 257/99 |
| 2007/0231978 A1 | 10/2007 | Kanamoto et al. |

FOREIGN PATENT DOCUMENTS

JP       2006-147914       6/2006

OTHER PUBLICATIONS

Joon Seop Kwap, et al., "Temperature-dependent contact resistivity of the nonalloyed ohmic contacts to p-GaN," Journal of Applied Physics, vol. 95, No. 10, May 15, 2004, pp. 5917-5919.

* cited by examiner

*Primary Examiner*—Thomas L Dickey
*Assistant Examiner*—Nikolay Yushin
(74) *Attorney, Agent, or Firm*—Oblon, Spivak, McClelland, Maier & Neustadt, L.L.P.

(57) ABSTRACT

A nitride semiconductor device according to the present invention includes a P-type contact layer and a P-type electrode provided on the P-type contact layer. The P-type electrode includes a AuGa film provided on the P-type contact layer, a Au film provided on the AuGa film, a Pt film 4 provided on the Au film, and a Au film provided on the Pt film. The ratio of the thickness of the AuGa film to the total thickness of the AuGa film and the Au film is not less than 12% but not more than 46%.

6 Claims, 5 Drawing Sheets

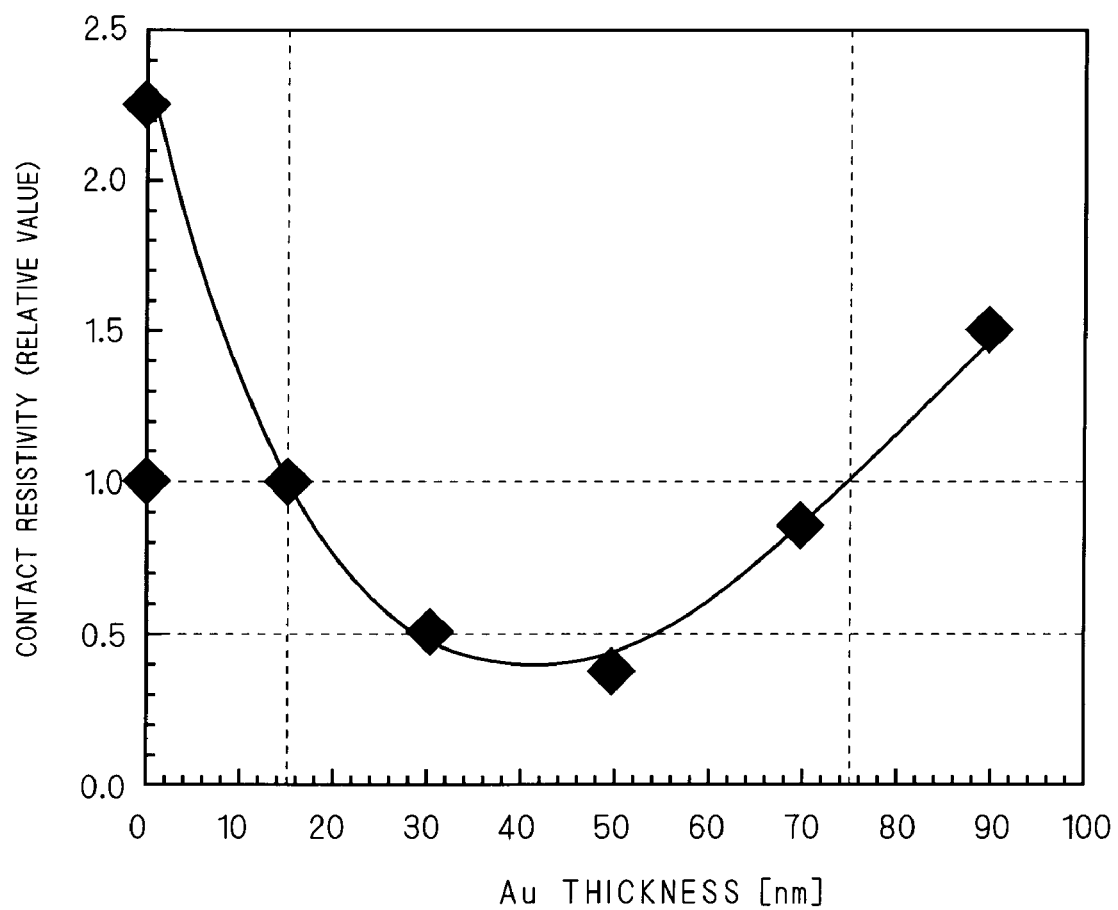
F I G . 8

NITRIDE SEMICONDUCTOR DEVICE AND METHOD OF MANUFACTURING THE SAME

BACKGROUND OF THE INVENTION

1. Field of the Invention

The present invention relates to nitride semiconductor devices including P-type electrodes and methods of manufacturing the same.

2. Description of the Background Art

In conventional nitride semiconductor devices, a P-type electrode is formed with palladium (Pd) as a P-type electrode material, as discussed in Journal of Applied Physics, Volume 95, Number 10, pp. 5917-5919.

When a laser diode is formed for example and P-type contact resistance is not sufficiently low in nitride semiconductor devices of conventional techniques, however, characteristic variations occur due to an increase in operating voltage for operating the laser diode and the generation of heat during the operation. This makes it difficult to obtain stable operation output in a prescribed temperature range. Therefore, it has been desired to further reduce contact resistance between a P-type contact layer and a P-type electrode.

SUMMARY OF THE INVENTION

It is an object of the present invention to provide a nitride semiconductor device including a P-type electrode having low contact resistance between a P-type contact layer and the P-type electrode, and a method of manufacturing the device.

In an aspect of the invention, a nitride semiconductor device includes: a P-type contact layer; a AuGa film on the P-type contact layer; and a Au film on the AuGa film. The ratio of a thickness of the AuGa film to the total thickness of the AuGa film and the Au film is not less than 12% but not more than 46%.

This can reduce P-type contact resistance lower than conventional resistance, thus lowering the operating voltage of a laser diode. This can then reduce the generation of heat during the operation, thereby attaining stable operation with high output in the long run.

In another aspect of the invention, a method of manufacturing a nitride semiconductor device includes the steps of: (a) forming a AuGa film on a P-type contact layer; (b) forming a Au film on the AuGa film; and (c) performing heat treatment on the AuGa film and the Au film. The steps (a) and (b) are performed so that the ratio of a thickness of the AuGa film to the total thickness of the AuGa film and the Au film is not less than 12% but not more than 46%.

This increases carrier concentration in the surface of the P-type contact layer, thereby obtaining a P-type electrode of low resistance.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 shows the relation between the thickness of a Au film and the relative value of contact resistivity.

DESCRIPTION OF THE PREFERRED EMBODIMENT

Figure 1:
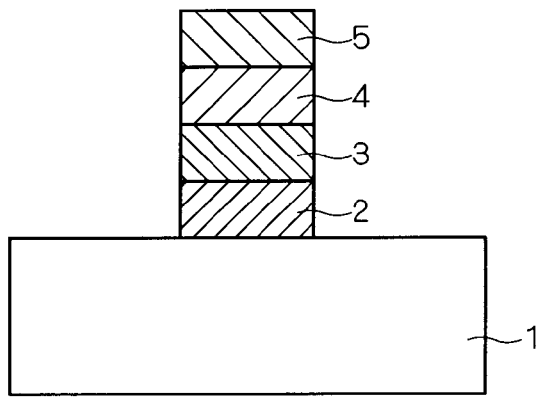
FIG. 1 is a cross-sectional diagram of a nitride semiconductor device according to a preferred embodiment of the present invention.

FIG. 1 is a cross-sectional diagram of a nitride semiconductor device according to the present embodiment. On a top surface of a P-type contact layer 1, P-type electrode materials including a AuGa film 2, a first Au film (hereafter indicated as a Au film 3), a Pt film 4, and a second Au film (hereafter indicated as a Au film 5) are provided in order.

Figure 2:
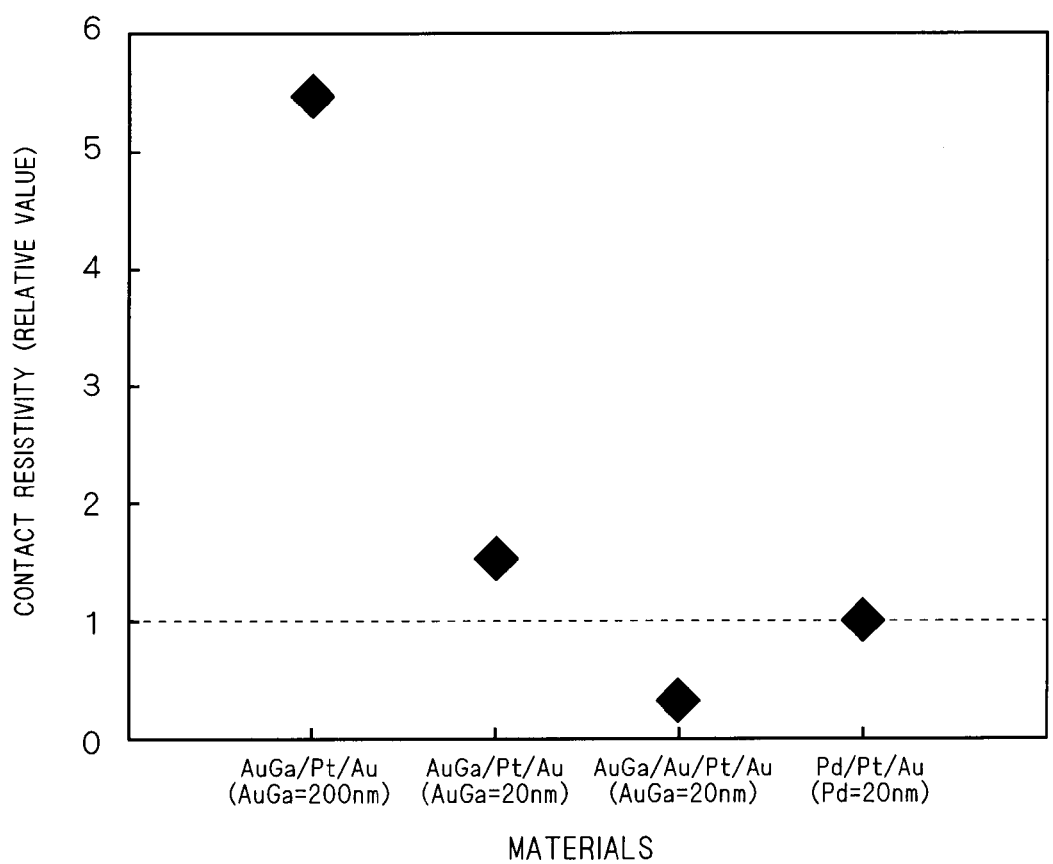
FIG. 2 shows the relation between electrode materials and a relative value of contact resistivity.

FIG. 2 shows the relation between a variety of P-type electrode materials and a relative value of contact resistivity. The term relative value of contact resistivity refers to the ratio to contact resistance between a P-type electrode using a conventional Pd film and the P-type contact layer 1. Likewise, FIGS. 6, 7 and 8 described later also show the ratio to contact resistance of a P-type electrode using a conventional Pd film. It is assumed that the Pt film 4 and the Au film 5 are provided both in the present invention and in conventional techniques.

Referring to FIG. 2, it is shown that the contact resistivity is high when only the AuGa film 2 is used instead of a Pd film which is used as a conventional P-type electrode material compared to the contact resistivity of a P-type electrode using a conventional Pd film. It is also shown that the contact resistivity increases by increasing the thickness of the AuGa film 2 from 20 nm to 200 nm. Yet it is shown that the use of the AuGa/Au structure according to the present invention instead of a conventional Pd film can reduce the contact resistivity almost by 70 percent compared to the contact resistivity of a P-type electrode using a conventional Pd film. It is shown from these facts that not the AuGa film 2 but a two-layered structure including the AuGa film 2 and the Au film 3 needs to be provided between the Pt film 4 and the P-type contact layer 1 in order to obtain a P-type electrode of low resistance.

Figure 3:
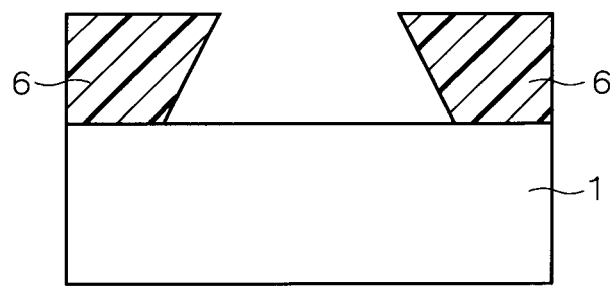
FIGS. 3 to 5 are cross-sectional diagrams of a method of manufacturing the nitride semiconductor device according to the preferred embodiment of the present invention.
Figure 4:
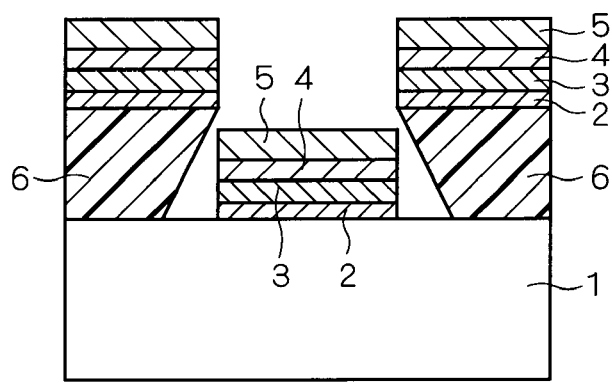
Figure 5:
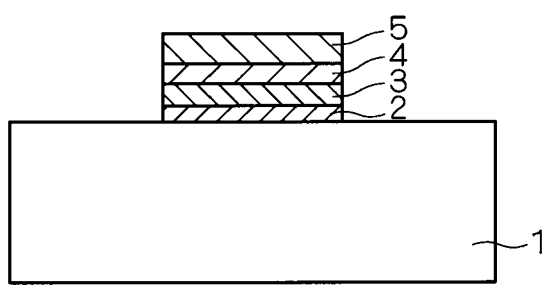

Referring to FIGS. 3 to 5, a method of manufacturing the nitride semiconductor device according to the present invention is described.

First, a resist film 6 for disposing P-type electrode materials selectively on the P-type contact layer 1 is formed (FIG. 3). Then, the AuGa film 2, the Au film 3, the Pt film 4, and the Au film 5 are deposited in order on the P-type contact layer 1 and the resist film 6 by an electronic beam (EB) evaporation method and the like (FIG. 4). After the deposition of the P-type electrode materials, unnecessary portions of the P-type electrode materials and the resist film 6 are removed by a lift-off method, to leave the P-type electrode materials only on the P-type contact layer 1 (FIG. 5). Subsequently, heat treatment is performed to form a P-type electrode having low contact resistance. P-type $Al_xGa_{1-x}N$ ($0 \leq x \leq 1$) may be used as the P-type contact layer 1, for example.

Table 1 shows the relation between the thickness of the AuGa film 2 and the adhesion of the AuGa film 2 to the P-type contact layer 1. Gallium in the AuGa film 2 improves the adhesion to the P-type contact layer 1. Specifically, the electrode materials formed on the P-type contact layer 1 prior to the heat treatment are processed by an ultrasonic cleaner at 45 kHz for one minute. When the thickness of the AuGa film 2 is not more than 5 nm, the AuGa film 2 and the P-type contact layer 1 become separated due to insufficient adhesion. The separation reduces yields of the device, and also increases variations in value itself of the contact resistivity. The adhesion of the AuGa film 2 to the P-type contact layer 1 is thus important, and is improved by setting the thickness of the AuGa film 2 to be greater than 5 nm.

TABLE 1

| | AuGa thickness [nm] | | | | |
|---|---|---|---|---|---|
| | 0 | 5 | 10 | 15 | 20 |
| Adhesion | X | X | ○ | ○ | ○ |

Figure 6:
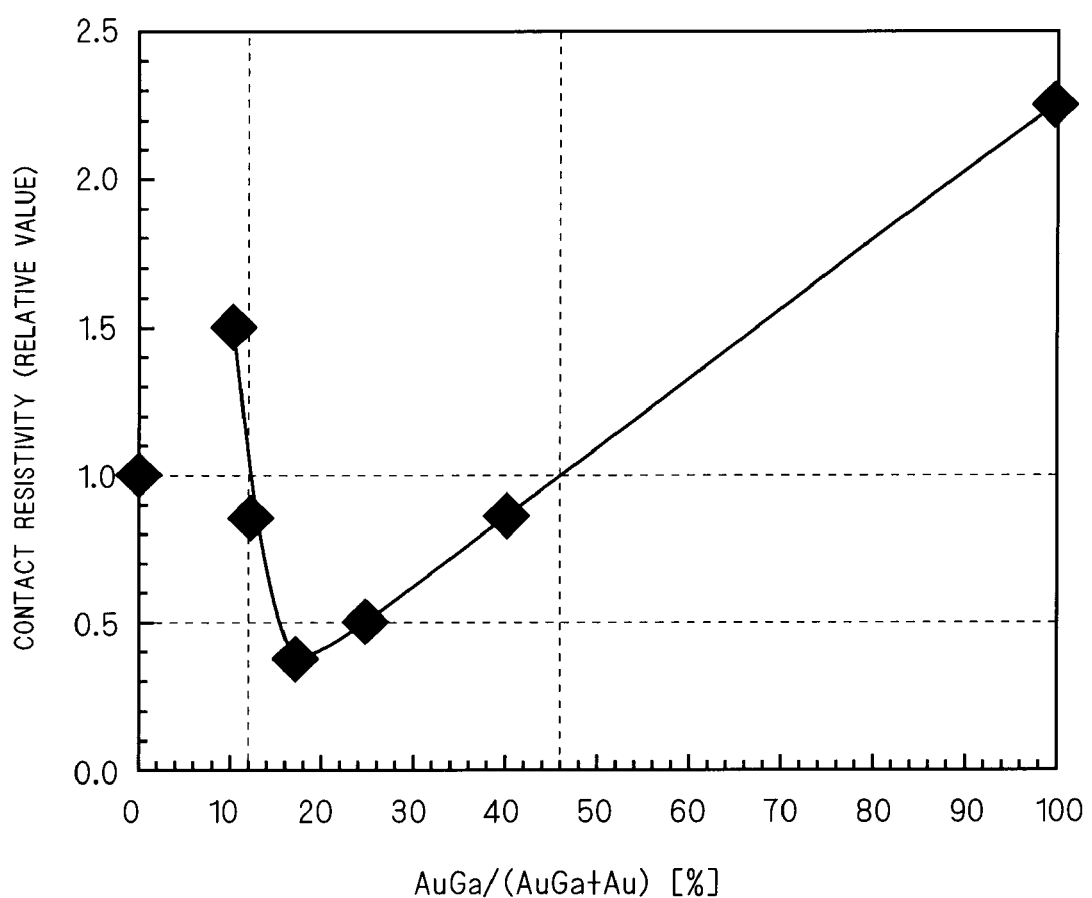
FIG. 6 shows the relation between a thickness ratio of AuGa/(Au+AuGa) and the relative value of contact resistivity.

Next, FIG. 6 shows the relation between the relative value of contact resistivity and the ratio of the thickness of the AuGa film 2 to the total thickness of the AuGa film 2 and the Au film 3. To obtain a lower contact resistance value than those of conventional nitride semiconductor devices, the relative value of contact resistivity needs to be not more than 1. A sufficient effect of resistance reduction will not be obtained with the value being not less than 1. It is desirable from the above that a ratio x of the thickness of the AuGa film 2 to the total thickness of the AuGa film 2 and the Au film 3 be set to be approximately $12\% \leq x \leq 46\%$ in order to obtain the effect of resistance reduction. Further, the relative value of contact resistivity can be significantly reduced to not more than 0.5 by setting the ratio of the thickness of the AuGa film 2 to be approximately $15\% \leq x \leq 25\%$.

Figure 7:
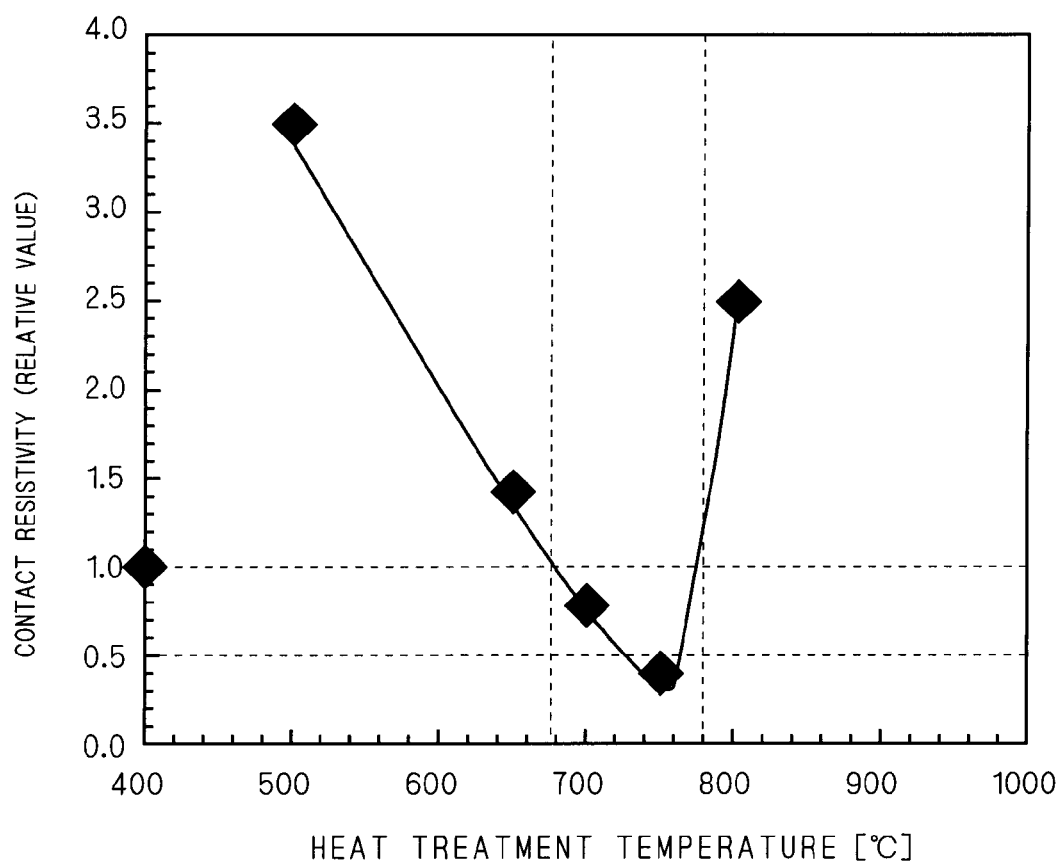
FIG. 7 shows the relation between a heat treatment temperature and the relative value of contact resistivity.

Next, FIG. 7 shows the relation between the relative value of contact resistivity and a heat treatment temperature. To obtain a lower contact resistance value than those of conventional nitride semiconductor devices, the relative value of contact resistivity needs to be not more than 1. A sufficient effect of resistance reduction will not be obtained with the value being not less than 1. It is desirable from the above that the heat treatment temperature be set to be approximately not less than 680° C. but not more than 780° C. in order to obtain the effect of resistance reduction.

With this structure, the heat treatment causes nitrogen atoms in the P-type contact layer 1 to be drawn to the vicinity of the surface of the P-type contact layer 1 as a P-type semiconductor due to the AuGa film 2. This causes nitrogen holes to be filled with the drawn nitrogen atoms in the surface of the P-type contact layer 1, thus preventing the vicinity of the surface of the P-type semiconductor forming the P-type contact layer 1 from becoming N-type.

Further, Ga atoms in the surface of the P-type contact layer 1 are pulled out into the Au film 3 due to the AuGa film 2 and the Au film 3 to form Ga Vacancy in the surface of the P-type contact layer 1, thus strengthening the P-type characteristic of the surface of the P-type semiconductor. The Ga Vacancy then take in acceptor impurities, thus further strengthening the P-type characteristic of the surface of the P-type semiconductor. This increases carrier concentration in the surface of the P-type contact layer 1, thereby obtaining a P-type electrode of low resistance.

The Pt film 4 diffuses through the Au film 3. The Au film 3 adjusts the amount of diffusion of the Pt film 4. Namely, the Pt film 4 reaches the P-type contact layer 1 whose Ga atoms have been pulled out and whose carrier concentration of the surface has increased, thereby obtaining a P-type electrode of low resistance.

In order for this phenomenon to occur, a thickness structure of AuGa/Au=10/50 nm is needed, for example. When the Au film 3 is too thin, the Pt film 4 reaches the surface of the P-type contact layer 1 before the modification of the surface, making it difficult to improve the resistance. When the Au film 3 is too thick, the Pt film 4 does not reach the surface of the P-type contact layer 1 after the modification of the surface, making it difficult to improve the resistance. Further, while prolonged processing may be performed to diffuse the Pt film 4 when the Au film 3 is thick, this causes not only Ga atoms but N atoms to be pulled out of the P-type contact layer 1 to cancel the increased carriers, making it impossible to improve the resistance.

The heat treatment may be performed in an atmosphere of air, nitrogen, oxygen, and inert gas. The inclusion of oxygen facilitates reaction at an interface between the P-type contact layer 1 and the AuGa film 2. More specifically, the aforementioned Ga Vacancy in the P-type contact layer 1 are formed effectively by the processing in the atmosphere including oxygen, thereby further increasing the carrier concentration in the surface of the P-type contact layer 1 and reducing resistance.

The AuGa film 2 and the Au film 3 may be alloyed depending on the conditions of the heat treatment. Gallium is distributed in this alloyed film. In this case, the carrier concentration in the surface of the P-type contact layer 1 increases as in the case of the two-layered structure of the AuGa film 2 and the Au film 3, thereby obtaining a P-type electrode of low resistance. Gallium that is nonuniform before the heat treatment will be distributed effectively.

Next, FIG. 8 shows the relation between the relative value of contact resistivity with the AuGa film 2 being 10 nm thick and the thickness of the Au film 3. To obtain a lower contact resistance value than those of conventional nitride semiconductor devices when the AuGa film 2 is 10 nm thick, the relative value of contact resistivity needs to be not more than 1. A sufficient effect of resistance reduction will not be obtained with the value being not less than 1. It is desirable from the above that a thickness x of the Au film 3 be set to be approximately $15 \leq x \leq 75$ nm in order to obtain the effect of resistance reduction. Further, the relative value of contact resistivity can be significantly reduced to not more than 0.5 by setting the thickness of the Au film 3 to be approximately $30 \leq x \leq 55$ nm.

In this manner the contact resistance between the P-type contact layer 1 and the P-type electrode can be reduced by providing the two-layered structure of the AuGa film 2 and the Au film 3 instead of a conventional Pd film as a P-type electrode material. This can reduce the operating voltage of the device and reduce the influence of heat generation, thereby attaining high output with stable operation output.

While the invention has been shown and described in detail, the foregoing description is in all aspects illustrative and not restrictive. It is therefore understood that numerous modifications and variations can be devised without departing from the scope of the invention.

What is claimed is:

1. A nitride semiconductor device comprising: a P-type contact layer; a AuGa film on said P-type contact layer; and a first Au film on said AuGa film, wherein the ratio of a thickness of said AuGa film to the total thickness of said AuGa film and said first Au film is not less than 15% but not more than 25%, and said thickness of said AuGa film is more than 5 nm but less than 20 nm, and said nitride semiconductor device has a relative value of contact resistivity of 0.5 or less.

2. The nitride semiconductor device according to claim 1, further comprising:
a Pt film on said first Au film; and
a second Au film on said Pt film.

3. The nitride semiconductor device according to claim 1, wherein said AuGa film and said first Au film are alloyed.

4. A nitride semiconductor device comprising: a P-type contact layer; a AuGa film on said P-type contact layer; and a first Au film on said AuGa film; wherein the ratio of a thickness of said AuGa film to the total thickness of said AuGa film and said first Au film is not less than 15% but not more than 25%, said thickness of said AuGa film is 10 nm, said thickness of said first Au film is not less than 30 nm but not more than 55 nm and said nitride semiconductor device has a relative value of contact resistivity of 0.5 or less.

5. A method of manufacturing a nitride semiconductor device, comprising:
(a) forming a AuGa film on a P-type contact layer; (b) forming a first Au film on said AuGa film, wherein (a) and (b) are performed so that the ratio of a thickness of said AuGa film to the total thickness of said AuGa film and said first Au film is not less than 15% but not more than 25%, and (c) performing heat treatment on said AuGa film and said first Au film, wherein a temperature range of said heat treatment is not less than 680° C. but not more than 780° C., and said heat treatment is performed in an atmosphere including oxygen, and said nitride semiconductor device has a relative value of contact resistivity of 0.5 or less.

6. The method of manufacturing a nitride semiconductor device according to claim 5, further comprising, after (b):
(d) forming a Pt film on said first Au film; and
(e) forming a second Au film on said Pt film, wherein heat treatment is performed on said Pt film and said second Au film as well in (c).

* * * * *